US005804505A

United States Patent [19]

Yamada et al.

[11] Patent Number: 5,804,505

[45] Date of Patent: Sep. 8, 1998

[54] METHOD OF PRODUCING SEMICONDUCTOR DEVICE HAVING BURIED CONTACT STRUCTURE

[75] Inventors: Yoshiaki Yamada; Kiyonori Kajiyana, both of Tokyo, Japan

[73] Assignee: NEC Corporation, Tokyo, Japan

[21] Appl. No.: 679,489

[22] Filed: Jul. 12, 1996

Related U.S. Application Data

[63] Continuation of Ser. No. 139,749, Oct. 22, 1993, abandoned.

[30] Foreign Application Priority Data

Oct. 27, 1992 [JP] Japan .................................... 4-288031

[51] Int. Cl.$^{6}$ .................................................... H01L 21/44

[52] U.S. Cl. ........................... 438/643; 438/653; 438/906

[58] Field of Search .................................... 437/187, 190, 437/194, 946; 438/643, 653, 906

[56] References Cited

U.S. PATENT DOCUMENTS

| | | | |
|---|---|---|---|
| 4,668,335 | 5/1987 | Mockler et al. | 156/643 |
| 4,926,237 | 5/1990 | Sun et al. | 357/71 |
| 4,951,601 | 8/1990 | Maydan et al. | 118/719 |
| 5,035,768 | 7/1991 | Mu et al. | 156/626 |
| 5,164,330 | 11/1992 | Davis et al. | 437/192 |
| 5,176,792 | 1/1993 | Fullowan et al. | 156/652 |
| 5,204,285 | 4/1993 | Kakiuchi | 437/187 |
| 5,221,640 | 6/1993 | Sato | 437/157 |
| 5,223,443 | 6/1993 | Chinn et al. | 437/8 |
| 5,229,325 | 7/1993 | Park et al. | 437/187 |
| 5,232,872 | 8/1993 | Ohba | 437/192 |
| 5,348,892 | 9/1994 | Miyake et al. | 437/3 |

FOREIGN PATENT DOCUMENTS

| | | |
|---|---|---|
| 0309274 | 3/1989 | European Pat. Off. . |
| 0324198 | 7/1989 | European Pat. Off. . |
| 0571691 | 12/1993 | European Pat. Off. . |

OTHER PUBLICATIONS

Ghandhi, "VLSI Fabrication Principles", pp. 475–477, pp. 517–520, 1983.

Wolf et al., "Silicon Processing for the VLSI Era; vol. I–Process Technology", 1986, pp. 514–520.

Patent Abstracts of Japan, vol. 8, No. 81 (E–238) [1518], Apr. 13, 1984.

Abstract of JP 59–3927A, published Jan. 10, 1984.

H. Korner, et al., "Investigations on a Two Step Approach for Contact Hole Filling with CVD—Tungsten Tungsten", in and Other Advanced metals for ULSI Applications in 1990, Proceedings of the 1990 Workshop, VLSI VI, pp. 369–377.

*Primary Examiner*—John Niebling
*Assistant Examiner*—Richard A. Booth
*Attorney, Agent, or Firm*—Sughrue, Mion, Zinn, Macpeak & Seas, PLLC

[57] ABSTRACT

Disclosed herein is a method of producing a semiconductor device which includes the steps of forming a hole in an insulating film covering a semiconductor substrate, forming a titanium nitride layer on surfaces of the hole and the insulating film, depositing tungsten on the titanium nitride layer with filling the hole to thereby form a blanket tungsten layer, etching back the blanket tungsten layer by a plasma gas including fluorine until the titanium nitride layer is exposed to thereby form a tungsten plug filling the hole, cleaning the titanium nitride layer to remove fluorine adhering to and remaining on the titanium nitride layer, and forming an aluminum layer on the cleaned titanium layer and the tungsten plug.

7 Claims, 3 Drawing Sheets

40 26-1 40 26-2 40 25 24 23 22 21

26-1 26-2 25 24 23 22 21

METHOD OF PRODUCING SEMICONDUCTOR DEVICE HAVING BURIED CONTACT STRUCTURE

This is a Continuation of application Ser. No. 08/139,749 filed Oct. 22, 1993 now abandoned.

BACKGROUND OF THE INVENTION

The present invention relates to a method of producing a semiconductor device having the so-called buried contact structure and, more particularly, to an improvement in method for forming such a buried contact structure that a hole provided in an interlayer insulating film is buried with tungsten (W).

In accordance with an increase in integration density of an integrated circuit device, fine metallization and a multi-level wiring structure have been advanced. A hole such as a contact hole and a viahole provided in an interlayer insulating film becomes small and fine accordingly. That is, the width of the hole is made small more and more. On the other hand, however, the depth of the hole is not substantially changed as compared to a conventional small or medium integrated circuit device. Thus, the ratio of the depth of the hole to the width thereof, i.e. the aspect ratio, has been made large. The contact hole is used for connecting a wiring layer to an element region and the viahole is used for connecting a lower-level wiring layer to an upper-level wiring layer.

The wiring layer is generally made of aluminum or an aluminum alloy consisting of aluminum and other metals such as silicon and copper. The wiring layer made of aluminum or aluminum alloy is called hereinafter an "aluminum wiring layer". In forming the aluminum wiring layer, the interlayer insulating film having the hole is deposited with an aluminum (alloy) layer by a sputtering method, followed by patterning the aluminum layer thus deposited to form the wiring layer. As well known in the art, however, the aluminum layer deposited by the sputtering method cannot completely fill the hole having a large aspect ratio. The breakdown of the aluminum wiring layer thus occurs in the hole.

Therefore, a buried contact structure has been proposed and put into practical use. This structure is such that the hole provided in the interlayer insulating film is filled with a refractory metal such as tungsten like a plug. The aluminum wiring layer is thereafter formed in contact with the tungsten plug filling the hole.

Two methods are known in the art to fill the hole with the tungsten plug. One is to deposit tungsten only in the hole by a selective chemical vapor deposition (CVD) method. However, the selective tungsten deposition into the hole suffers from hardly controllable silicon erosion which often leads to scattering contact resistance. The other is to deposit tungsten over the entire surface with filling the hole as a blanket tungsten layer by a well-known CVD method, followed by carrying out an etchback process on the blanket tungsten layer to form the tungsten plug filling the hole. This second method does not cause the above-mentioned drawback and is thus effective to form the tungsten plug. The second method was announced in "Proceedings of the 1990 Workshop" held on Oct. 22–24, 1990 entitled "Tungsten and Other Metals for ULSI Applications in 1990" and is disclosed in "Conference Proceedings, VLSI, VI", pp. 369–377, as entitled "Investigations on a Two Step Approach for Contact Hole Filling with CVD-Tungsten", published in 1991. In the following, the description on the application of the second method to a device will be made below with reference to FIGS. 1A to 1E.

Referring to FIG. 1A, a silicon substrate 21 having an element region 30 is covered with a silicon oxide film 23 as an interlayer insulating film. A polysilicon layer 22 serving as a lower-level wiring layer is buried in the oxide film 23. The oxide film 23 is then subjected to a selective etching process to form a contact hole 31 exposing a part of the region 30 and a viahole 32 exposing a part of the wiring layer 22.

As shown in FIG. 1B, thereafter, a titanium (Ti) layer 24 and a titanium nitride (TiN) layer 25 are deposited in that order on the entire surface by the CVD method. The Ti layer is 10–100 nm in thick and the TiN layer is 50–200 nm in thick.

The CVD method using $WF_6/H_2$ is then carried out to form a blanket tungsten layer 26, as shown in FIG. 1C. Specifically, $WF_6$ is reduced by hydrogen and tungsten is thereby deposited on the entire surface of the TiN layer 25. The blanket tungsten layer 26 is thus formed. It is preferable that a thin tungsten film by reducing WH by silane ($SiH_4$) is formed before reducing $WF_6$ by hydrogen.

Subsequently, the dry etching process using $SF_6$ as an etching gas is performed to etch the blanket tungsten layer 26 back. That is, the tungsten layer 26 is etched back until the TiN layer 25 covering the portion except the holes 31 and 32 are exposed. A tungsten plug 26-1 filling the hole 31 and a tungsten plug 26-2 filling the hole 32 are thus formed, as shown in FIG. 1D.

Aluminum or aluminum alloy is deposited over the entire layer by the sputtering method, followed by patterning to aluminum wiring layers 27-1 and 27-2, as shown in FIG. 1E. By using the layers 27-1 and 27-2 as a mask, the TiN layer 25 and Ti layer 24 are then selectively removed to thereby form upper-level wiring layers. Thus, a semiconductor device having a buried contact structure is produced.

However, such a defect as a short circuit between the adjacent aluminum wiring layers has been measured in some devices produced by the above method. Such another defect has been further measured that the adhesion between the aluminum wiring layer and the TiN layer is weakened. According to the present inventors investigation, it has been found that such defects are caused by particles made of titanium fluoride such as TiF formed on the TiN layer 25. More specifically, as shown in FIGS. 1C and 1D, the blanket tungsten layer 26 is etched back by the SF plasma in the dry etching process until the TiN layer 25 is exposed. That is, the TiN layer 25 is also subject to the SF plasma, so that fluorine in the $SF_6$ plasma adheres to and remains on the surface of the TiN layer 25, is denoted by a reference numeral 40 in FIG. 1D. Since fluorine is relatively active, the fluorine thus adhering to or being absorbed by the TiN layer 25 reacts with titanium in the TiN layer 25 in a few hours to form a particle of titanium fluoride. As a result, the titanium fluoride particles thus formed exist between the TiN layer 25 and each of the aluminum wiring layers 27-1 and 27-2, as shown by a reference numeral 45 in FIG. 1E, and weaken the adhesion therebetween. The titanium fluoride further affects the selective etching of the aluminum layer 27, so that a short circuit path (not shown in the drawing) may be formed between the adjacent wiring layers 27-1 and 27-2. Thus, the device produced by the prior art method has a problem on reliability in aluminum wiring layer.

SUMMARY OF THE INVENTION

It is therefore an object of the present invention to provide an improved method of producing a semiconductor device having a buried contact structure.

It is another object of the present invention to provide a method of producing a semiconductor device, which enhances reliability in aluminum wiring layer.

A method of the present invention is featured by further having a step of, after etching the blanket tungsten layer back, cleaning the surface of the TiN layer to remove fluorine adhering thereto or being reacted with titanium therein from the TiN layer, an aluminum layer being thereafter formed on the cleaned TiN layer.

Thus, no titanium fluoride exists between the aluminum wiring layer and the TiN layer to maintain the adhesion therebetween.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Figure 1A:
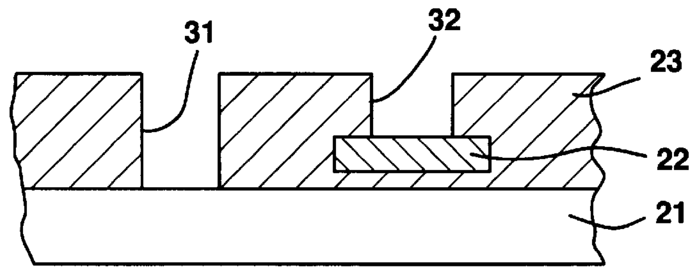
FIG. 1A to FIG. 1E are cross sectional views illustrative of respective steps of producing a semiconductor device according to the prior art.
Figure 1B:
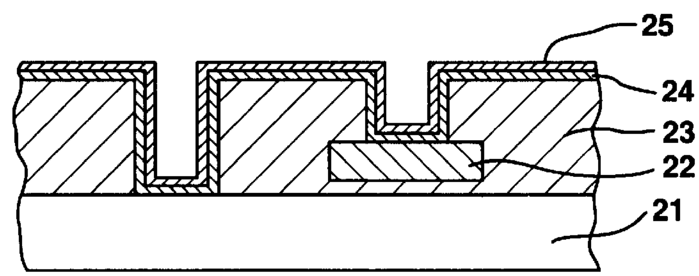
Figure 1C:
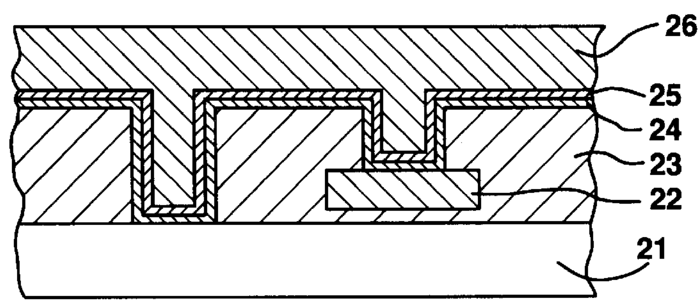
Figure 1D:
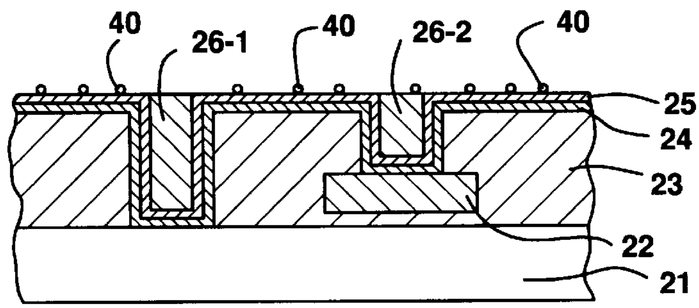
Figure 1E:
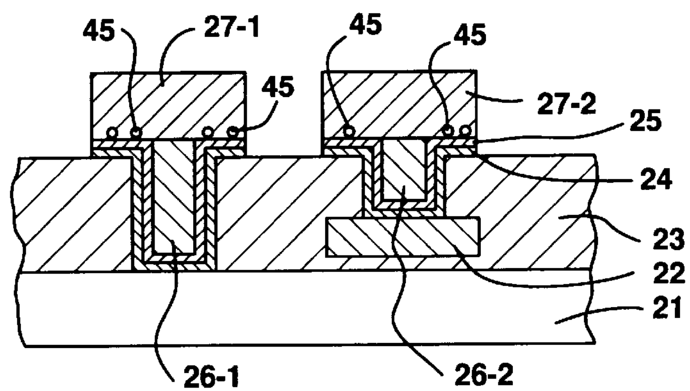

Referring to FIGS. 2A to 2F, there are shown the respective steps for producing a semiconductor device, in which the same constituents as those shown in FIG. 1 are denoted by the same reference numerals. As is apparent from the comparison between FIGS. 1 and 2, the steps shown in FIGS. 2A to 2D are the same as those shown in FIGS. 1A to 1D, respectively, and thus the further description thereof will be omitted.

Figure 2A:
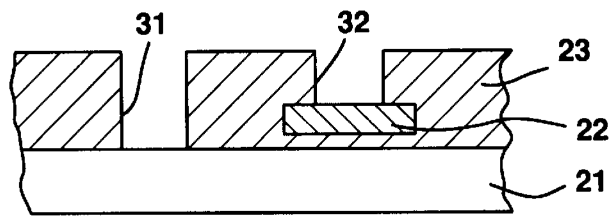
FIG. 2A to FIG. 2F are cross sectional views illustrative of respective steps of producing a semiconductor device according to an embodiment of the present invention.
Figure 2B:
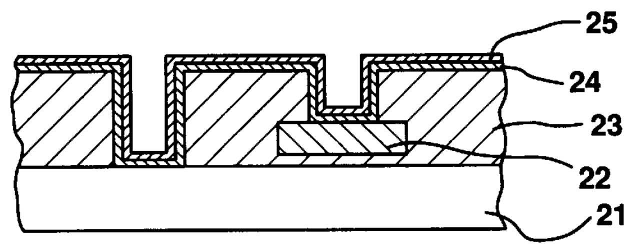
Figure 2C:
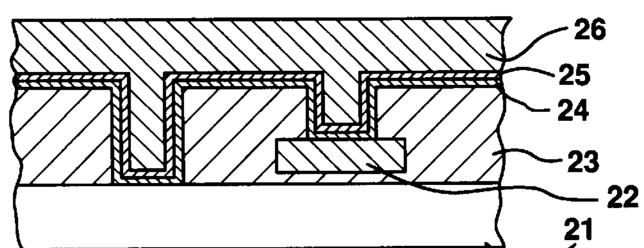
Figure 2D:
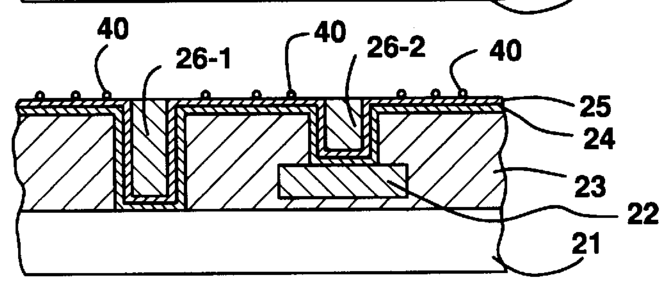

As described hereinbefore, as the result of the TiN layer 25 being subjected to the $SF_6$ plasma for etching the blanket tungsten layer 26 back, fluorine 40 in the plasma adheres to and remains on the TiN layer 25. In order to remove fluorine 40 on the TiN layer 25, the silicon wafer having the silicon substrate 21 thus formed is picked out of the CVD chamber and conveyed into an oven (not shown) before fluorine 40 reacts with titanium in the TiN layer 25 to form the titanium fluoride particle. In other words, the wafer after the step shown in FIG. 2D is conveyed into the oven within a few hours. In the oven, the wafer is heated at about 200° C. for 0.5–1.0 hour in an inert gas such as $N_2$ or argon. By this heat treatment, fluorine 40 is disconnected from the TiN layer 25 and exhausted. The surface of the TiN layer 25 is thereby cleaned up and converted into a substantially fluorine-free surface, as shown in FIG. 2E.

The wafer is thereafter picked out of the oven and conveyed to the sputtering apparatus. Aluminum or aluminum alloy consisting of aluminum, silicon and copper is then spattered on the entire surface including the TiN layer 25 and the tungsten plugs 26-1 and 26-2, followed by selectively etching. Aluminum wiring layers 27-1 and 27-2 are thereby formed. The TiN layer 25 is then selectively removed by using the layers. 27-1 and 27-2 as a mask, as shown in FIG. 2F. Since fluorine 40 is removed from the TiN layer 25, no titanium fluoride particle exists between the wiring layers 27 and the associated TiN layer 25.

Figure 2E:
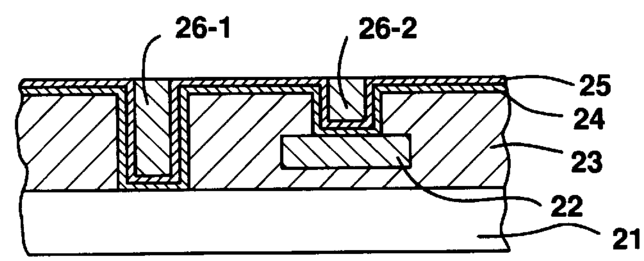
Figure 2F:
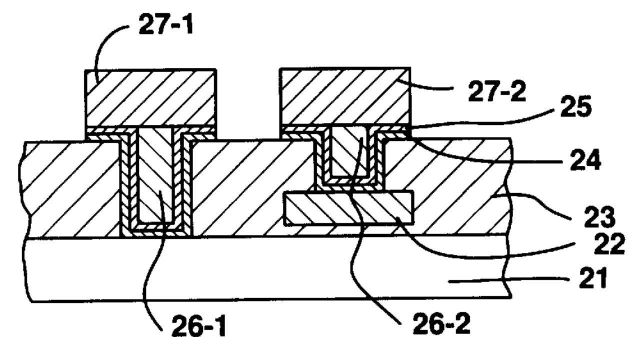

In the step of FIG. 2E, a temperature of 150° C. or more is required to disconnect fluorine 40 from the TiN layer 25. On the other hand, a temperature above 450° C. damages the silicon wafer. Therefore, the heat treatment in the step of FIG. 2E is required to be carried out at a temperature between 150°–450° C. This heat treatment may be carried out in an oxidizing atmosphere in place of the inert gas. In this case, a titanium oxide film and a tungsten oxide film are formed on the TiN layer 25 and the tungsten plugs 26, respectively. Therefore, these oxide films are preferably removed to reduce a contact resistance between the aluminum wiring layers 27-1 and 27-2 and the layers 25 and plugs 26-1 and 26-2.

Fluorine 40 adhering to the TiN layer 25 can be removed by a pure water before fluorine reacts with titanium to form a titanium fluoride particle. Accordingly, as another method for removing fluorine from the TiN layer 25, the wafer after the step of FIG. 2D may be cleaned by pure water.

On the other hand, if fluorine 40 has reacted with titanium, the titanium fluoride particle cannot removed by the above methods. In this case, the wafer is required to be subjected to an alkali solution such as ammonia or sputtering etching using an argon gas.

Although various methods for removing fluorine or titanium fluoride particle from the TiN layer 25 has been described above, the first-mentioned method, i.e. the heat treatment in the inert gas is the most effective. This is because that method is the most convenient and no additional equipment is required. The oven is used in common to anneal the aluminum wiring layer 27 for the purpose of reducing the contact resistance to the TiN layer 25.

Figure 3A:
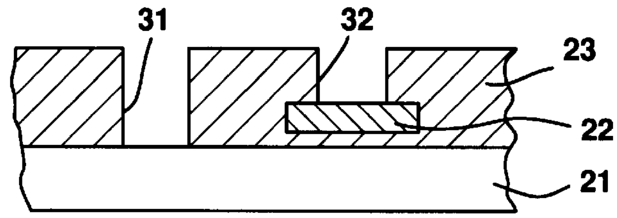
FIG. 3A to FIG. 3F are cross sectional views illustrative of respective steps of producing a semiconductor device according another embodiment of the present invention.
Figure 3B:
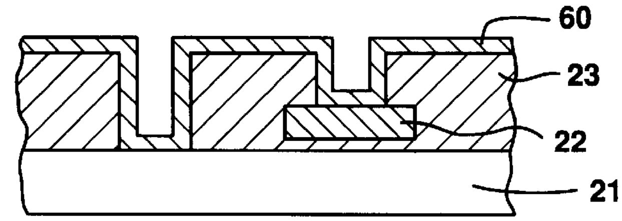
Figure 3C:
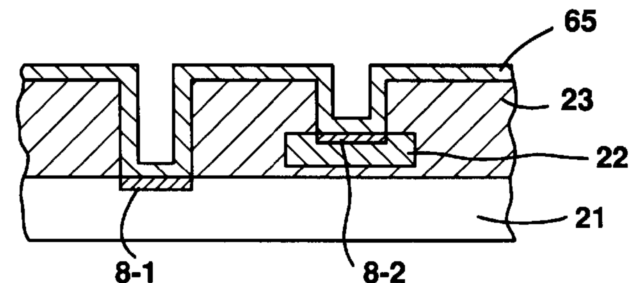
Figure 3D:
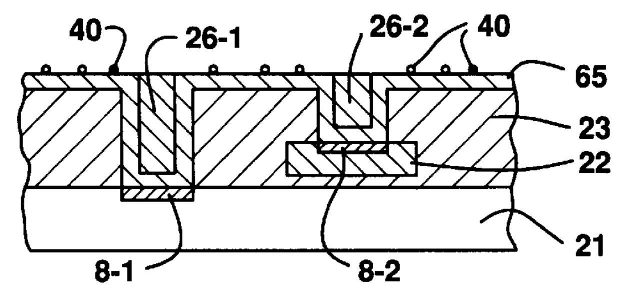
Figure 3E:
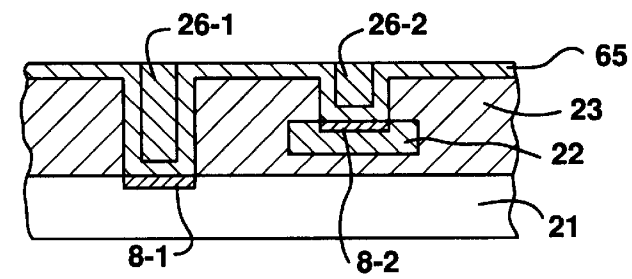
Figure 3F:
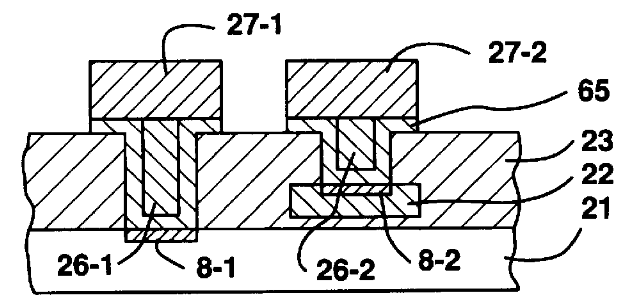

Turning to FIG. 3A, the interlayer insulating film 23 covering the silicon substrate 21 is selectively removed to form the holes 31 and 32 in such a manner as shown in FIG. 1A. This is followed by forming a titanium layer 60 over the entire surface by the sputtering method, as shown in FIG. 3B, in accordance with another embodiment of the present invention. The titanium layer 60 thus formed is then converted into a titanium nitride layer 65 by heating the wafer at a temperature of 600°–800° C. in a nitrogen or ammonia gas, as shown in FIG. 3C. At this time, titanium reacts with silicon, so that titanium silicide layers 8-1 and 8-2 are formed, as also shown in FIG. 3C. After this, as shown in FIGS. 3D to 3F, the same steps as those shown respectively in FIGS. 2D to 2F are performed, so that the upperlevel aluminum wiring layers are formed.

It is apparent that the present invention is not limited to the above embodiments, but may be modified and changed without departing from the scope and spirit of the invention. For example, as the lower-level wiring layer, an aluminum wiring layer can be employed in place of the polysilicon wiring layer 22.

What is claimed is:

1. A method of producing a semiconductor device comprising the steps of: forming a hole in an interlayer insulating film covering a semiconductor substrate, said interlayer insulating film thereby having a first surface defining said hole and a second surface extending in parallel to said semiconductor substrate, forming a metal layer including a titanium nitride layer on said first and second surfaces of said interlayer insulating film, depositing tungsten on said titanium nitride layer of said metal layer to form a blanket tungsten layer, said blanket tungsten layer thereby having a portion filling said hole, etching back said blanket tungsten layer until said titanium nitride layer covering said second surface of said interlayer insulating film is exposed, said portion of said blanket tungsten layer being thereby left to form a tungsten plug filling said hole, cleaning said titanium nitride layer by heating said titanium nitride layer before fluorine reacts with titanium in said titanium nitride layer to thereby remove said fluorine from said titanium nitride layer and to provide a cleaned titanium nitride layer, and after heating said titanium nitride layer to clean said titanium nitride layer, forming an aluminum layer on said cleaned titanium nitride layer.

2. The method as claimed in claim 1, wherein said semiconductor substrate is heated at a temperature between 150°–450° C.

3. A method of producing a semiconductor device comprising the steps of: forming a hole in an interlayer insulating film covering a semiconductor substrate, said interlayer insulating film thereby having a first surface defining said hole and a second surface extending in parallel to said semiconductor substrate, forming a metal layer including a titanium nitride layer on said first and second surfaces of said interlayer insulating film, depositing tungsten on said titanium nitride layer of said metal layer to form a blanket tungsten layer, said blanket tungsten layer thereby having a portion filling said hole, etching back said blanket tungsten layer by an etching gas including fluorine until said titanium nitride layer covering said second surface of said interlayer insulating film is exposed, said portion of said blanket tungsten layer being thereby left to form a tungsten plug filling said hole, cleaning said titanium nitride layer to remove fluorine therefrom and to provide a cleaned titanium nitride layer, and forming an aluminum layer on said cleaned titanium nitride layer, wherein said step of cleaning said titanium nitride layer is carried out by subjecting said titanium nitride layer to pure water before said fluorine reacts with titanium in said titanium nitride layer to form a titanium fluorine particle.

4. A method of producing a semiconductor device comprising the steps of: forming a hole in an interlayer insulating film covering a semiconductor substrate, said interlayer insulating film thereby having a first surface defining said hole and a second surface extending in parallel to said semiconductor substrate, forming a metal layer including a titanium nitride layer on said first and second surfaces of said interlayer insulating film, depositing tungsten on said titanium nitride layer of said metal layer to form a blanket tungsten layer, said blanket tungsten layer thereby having a portion filling said hole, etching back said blanket tungsten layer by an etching gas including fluorine until said titanium nitride layer covering said second surface of said interlayer insulating film is exposed, said portion of said blanket tungsten layer being thereby left to form a tungsten plug filling said hole, cleaning said titanium nitride layer to remove fluorine therefrom and to provide a cleaned titanium nitride layer, and forming an aluminum layer on said cleaned titanium nitride layer, wherein said step of cleaning said titanium nitride layer is carried out by subjecting said titanium nitride layer to an alkali solution before said fluorine reacts with titanium in said titanium nitride layer.

5. A method of producing a semiconductor device comprising the steps of: forming a hole in an interlayer insulating film covering a semiconductor substrate, said interlayer insulating film thereby having a first surface defining said hole and a second surface extending in parallel to said semiconductor substrate, forming a metal layer including a titanium nitride layer on said first and second surfaces of said interlayer insulating film, depositing tungsten on said titanium nitride layer of said metal layer to form a blanket tungsten layer, said blanket tungsten layer thereby having a portion filling said hole, etching back said blanket tungsten layer by an etching gas including fluorine until said titanium nitride layer covering said second surface of said interlayer insulating film is exposed, said portion of said blanket tungsten layer being thereby left to form a tungsten plug filling said hole, cleaning said titanium nitride layer to remove fluorine therefrom and to provide a cleaned titanium nitride layer, and forming an aluminum layer on said cleaned titanium nitride layer, wherein said step of cleaning said titanium nitride layer is carried out by subjecting said titanium nitride layer to an inert gas plasma before said fluorine reacts with titanium in said titanium nitride layer to thereby provide said cleaned titanium nitride layer.

6. A method for producing a semiconductor device comprising the steps of: forming a hole in an insulating film covering a semiconductor substrate, said insulating film thereby having a first surface defining said hole and a second surface extending in a horizontal direction, forming metal layer on said first and second surfaces of said insulating film, said metal layer including a titanium nitride layer constituting a surface portion of said metal layer, depositing tungsten on a surface of said titanium nitride layer to form a blanket tungsten layer, said blanket tungsten layer thereby having a portion filling said hole, etching back said blanket tungsten layer by a plasma gas including fluorine until a portion of said titanium nitride layer covering said second surface of said insulating film is exposed, said portion of said blanket tungsten layer being thereby left to form a tungsten plug filling said hole, said fluorine in said plasma gas adhering to and remaining on said titanium nitride layer, and heating said semiconductor substrate to remove said fluorine adhering to and remaining on said titanium nitride layer therefrom before said fluorine reacts with titanium in said titanium nitride layer to form a titanium fluoride particle.

7. The method as claimed in claim 6, wherein said semiconductor substrate is heated at a temperature of 150°–450° C.

* * * * *